United States Patent [19]

Schlosser

[11] Patent Number: 4,561,171

[45] Date of Patent: Dec. 31, 1985

[54] PROCESS OF GETTERING SEMICONDUCTOR DEVICES

[75] Inventor: Viktor Schlosser, Vienna, Austria

[73] Assignee: Shell Austria Aktiengesellschaft, Vienna, Austria

[21] Appl. No.: 481,396

[22] Filed: Apr. 1, 1983

[30] Foreign Application Priority Data

Apr. 6, 1982 [AT] Austria .................. 1366/82

[51] Int. Cl.[4] ............... H01L 21/20; H01L 21/322
[52] U.S. Cl. ..................... 29/572; 29/575; 29/576 T; 136/243; 148/1.5; 148/174; 148/DIG. 60; 148/DIG. 61; 426/86
[58] Field of Search ............. 148/1.5, 174, DIG. 60, 148/DIG. 61; 29/575, 572, 576 T; 136/243; 427/86

[56] References Cited

U.S. PATENT DOCUMENTS

| | | | |
|---|---|---|---|
| 3,632,438 | 1/1972 | Carlson et al. | 317/234 F |
| 3,701,696 | 10/1972 | Mets | 148/175 |
| 3,919,765 | 11/1975 | Schloetterer | 29/571 |
| 3,929,529 | 12/1975 | Poponiak | 148/1.5 |
| 4,001,864 | 1/1977 | Gibbons | 357/30 |
| 4,053,335 | 10/1977 | Hu | 148/1.5 |
| 4,134,125 | 1/1979 | Adams et al. | |
| 4,339,470 | 7/1982 | Carlson. | |
| 4,396,437 | 8/1983 | Kwok | 148/1.5 |

FOREIGN PATENT DOCUMENTS

| | | |
|---|---|---|
| 0000480 | 6/1978 | European Pat. Off. . |
| 0008406 | 8/1979 | European Pat. Off. . |
| 1539655 | 1/1970 | Fed. Rep. of Germany . |
| 1816083 | 6/1970 | Fed. Rep. of Germany . |
| 2028422 | 1/1971 | Fed. Rep. of Germany . |
| 2730367 | 1/1979 | Fed. Rep. of Germany . |
| 2738195 | 3/1979 | Fed. Rep. of Germany . |
| 145144 | 11/1980 | German Democratic Rep. . |
| 2038086 | 7/1980 | United Kingdom . |

OTHER PUBLICATIONS

*IBM Technical Disclosure Bulletin*, vol. 20, No. 9, Feb. 1978, by Poponiak et al.

*IEEE Transactions on Electron Devices*, "Impurity Gettering of Polycrystalline Solar Cells Fabricated from Refined Metallurgical–Grade Silicon," vol. ED–27, No. 4, Apr. 1980, by Saitoh et al.

Chen et al., "Post Epitaxial Polysilicon and Sl$_3$N$_4$ Gettering in Silicon", *J. Electrochem. Soc.: Solid State Science and Technology*, vol. 129, No. 6, pp. 1294 to 1299, Jun. 1982.

Pearce et al., "Considerations Regarding Gettering in Integrated Circuits", *Semiconductor Silicon, 1981*, The Electrochemical Society, pp. 705 to 723.

*Primary Examiner*—Melvyn J. Andrews
*Attorney, Agent, or Firm*—Spencer & Frank

[57] ABSTRACT

The invention relates to a process for gettering semiconductor devices. A getter layer of amorphous or microcrystalline silicon is applied to the device. The so coated device is thermally treated and the getter layer is removed.

21 Claims, No Drawings

PROCESS OF GETTERING SEMICONDUCTOR DEVICES

BACKGROUND OF THE INVENTION

The present invention relates to a process for gettering semiconductor devices, particularly silicon semiconductor devices and to the semiconductor devices obtained from this process.

In the semiconductor art, gettering is understood to mean the subsequent removal of interfering impurities from semifinished or finished semiconductor devices.

Known gettering methods for devices based on crystalline silicon are, for example, the application of $P_2O_5$, $B_2O_3$ and similar glass oxides to the active region of the device, producing greatly disturbed surfaces on the rear of the device, e.g. by ion bombardment or mechanical roughing, providing nitride layers on the rear of the device or high temperature tempering in a nitrogen atmosphere. The gettering has the effect that in the active zone of the device interfering foreign atoms, particularly heavy metals, diffuse preferably into the getter layer, which is then removed so that less impurities remain in the device. Crystal defects are electronically inactivated by diffusing out silicon atoms and/or foreign atoms and subsequent rearrangement of the silicon crystal lattice. Usually, the gettering process is a combination of these two procedures.

In addition to having a number of advantages, the known gettering methods also have several considerable drawbacks. For example, in the first-mentioned method, (applying $P_2O_5$, $B_2O_3$ and similar glass oxides to the active region of the device), although the getter layer acts directly on the active zone of the device and permits the realization of a high gettering effect with a short gettering time of about one hour, these getter materials discharge undesirable impurities into the silicon layer. Moreover, this getter layer can sometimes be removed only with difficulty. Although with the creation of greatly disturbed surfaces on the rear of the device, the electronic properties are not influenced, because no foreign atoms are present, and the getter layer can be removed again with ease, the gettering in this process is effected from the rear of the device through the entire base material. To therefore improve the active layer, long gettering times are required (6 to 24 hours). The application of nitride layers to the rear of the device has the advantage of less influence of nitrogen as an impurity, but has the same drawback as the process described above, particularly the long gettering times. With high temperature tempering of the silicon semiconductor device in a nitrogen atmosphere, the small influence of nitrogen as an impurity is an advantage, but long gettering times and high temperatures are again required because the surrounding gas atmosphere acts as a low density getter.

Thus all previously known gettering methods have considerable deficiencies, such as the discharge of interfering impurities into the active region of the device and long gettering times at increased temperature which cause doping profiles in the device to shift and thus make it unusable.

SUMMARY OF THE INVENTION

There thus still exists a need for processes for gettering semiconductor devices, particularly those on a silicon base, which processes do not have the above-outlined drawbacks of the known methods, are as simple to practice as possible and result in a substantial removal of interfering impurities from finished or semifinished semiconductor devices within a short period of time.

It has now been found that these goals can be attained by a novel process for gettering semiconductor devices, particularly silicon semiconductor devices, where no inclusion of interfering foreign atoms is involved, which acts directly on the active layer and permits easy removal of the getter layer after short gettering times.

Thus, it is the object of the present invention to provide a method for gettering semiconductor devices, particularly silicon semiconductor devices in which amorphous or microcrystalline silicon is applied to the device as getter layer, the coated device is subjectd to a thermal treatment and finally the getter layer is removed.

DETAILED DESCRIPTION OF THE INVENTION

The first step in the process according to the invention, the application of amorphous/microcrystalline silicon, preferably in layer thicknesses from several 100 Å to 10 microns, onto a semiconductor device, e.g. a solar cell, can be effected according to the following exemplary methods:

(1) depositing from the vapor phase by thermal decomposition of suitable silicon compounds (e.g. $SiCl_4$, $SiHCl_3$);
(2) depositing from the vapor phase by decomposition of suitable silicon compounds (e.g. $SiH_4$) by means of glow discharge;
(3) thermal evaporation of silicon;
(4) electron beam evaporation of silicon;
(5) sputtering by means of silicon targets;
(6) depositing a crystalline (monocrystalline or polycrystalline) silicon layer by means of suitable methods and subsequent destruction of this layer by means of ions or electron bombardment (transformation to amorphous/microcrystalline silicon).

According to a particularly advantageous embodiment of the process according to the invention, the gettering effect of the amorphous or microcrystalline silicon can be improved considerably in that, before performing the second step of the entire process, i.e. the thermal treatment of the coated device, at least one further thin dielectric layer is deposited onto the amorphous or microcrystalline silicon. In this case, one or a plurality of thin dielectric layers (30 Å to 3 microns) are applied before the start of the thermal treatment.

Due to the different coefficients of thermal expansion of crystalline silicon and the dielectric material, stresses are created in the crystalline silicon which influence the formation of the crystal lattice in such a manner that interfering foreign atoms can move with greater ease (i.e. faster) in the crystal lattice. Moreover, the atomic composition of the amorphous silicon below the dielectric layer is changed with the result that impurity atoms which have diffused from the silicon crystal into the layer of amorphous silicon, can be bound therein particularly easily and effectively (e.g., oxygen from the dielectric layer can diffuse into the layer of amorphous silicon and here cause oxide formation of the impurity atom).

As a consequence of such behavior, a higher saturation concentration of the foreign atoms can be realized in the layer of amorphous silicon and the rediffusion of gettered impurity atoms can be reduced.

The material particularly suitable for the further thin dielectric layer(s) applied according to the invention is, in particular, $SiO_x$, where $1 \leq x \leq 2$, but also $Al_2O_3$, $Si_3N_4$, $ZrSi_2$ or $TiSi_2$ or $MgO$, $BeO$, $ZrO_2$ or $TiO_2$, respectively, which may be applied onto the amorphous silicon/microcrystalline silicon according to one of the following exemplary methods:

(1) depositing from a vapor phase suitable chemical substances whose reaction product is precipitated on the amorphous silicon/microcrystalline silicon (e.g., $SiH_4$ and $O_2$ to form $SiO_x$; Al, HCl, $CO_2$, $H_2$ for $Al_2O_3$; $SiCl_4$ and $NH_3$ for $Si_3N_4$, $SiCl_4$ or $SiHCl_3$ and $ZrCl_4$ or $TiCl_4$, respectively, and $H_2$ for $ZrSi_2$ or $TiSi_2$, respectively, and $HCl$-$MgCl_2$-$CO_2$-$H_2$ for MgO);

(2) a process as described in (1), above, but supported by a glow discharge;

(3) thermal evaporation of the materials;

(4) electron beam evaporation of the materials;

(5) sputtering by means of suitable targets;

(6) reactive sputtering in a suitable gas atmosphere (e.g. sputtering of Si in a defined $O_2$ atmosphere).

After the application of the additional dielectric layer(s), the second step of the entire process, i.e. the thermal treatment of the coated device, is performed. This thermal treatment is advantageously effected in such a manner that the device is heated in a suitable gas atmosphere, e.g. in $H_2$, $N_2$, noble gases or in a vacuum, for a period of time, e.g. 10 minutes to 6 hours, to a suitable temperature of, e.g., 200° to 1200° C., preferably to 600° to 900° C.

The third and final step of the complete process according to the invention, i.e. the removal of the getter layer, can advisably be effected according to one of the following methods:

(1) removal of the layer by means of a combination of acids (e.g., $HNO_3$ and HF in a favorable ratio and diluted with water);

(2) removal of the layer by action of a suitable gas atmosphere, e.g. HCl vapor, diluted with $H_2$ gas, at a temperature of 1275° C.;

(3) removal of the layer by ion etching (dry etching) with suitable ions;

(4) mechanical removal by means of suitable grinding and lapping agents (e.g. $Al_2O_3$ powder).

Before performing the third and final step of the entire process, i.e. the removal of the getter layer, or, depending on the process employed, also in a step together with the final step, the facultative additional dielectric layer(s) is(are) removed, with the removal of the getter layer by action of a suitable gas atmosphere or removal of the getter layer by ion etching (dry etching) also being suitable for the removal of the additional materials applied according to the invention. When the getter layer is removed with the aid of an acid mixture, it may be necessary, before the removal of the amorphous silicon/microcrystalline silicon, to remove the additional dielectric layer(s) with a specific etching solution, e.g. a combination of $NH_4F$, $NH_4OH$ and HF, diluted with water, for $SiO_x$, or $Al_2O_3$ or $H_3PO_4$, rsepectively, for $Si_3N_4$. A further suitable process is to remove all layers mechanically by means of a suitable grinding and lapping process.

The process according to the invention is excellently suited to getter silicon solar cells. These comprise three components:

(a) Substrate: suitable materials are, in particular, polycrystalline ferrosilicon (metallurgical silicon), raw silicon, polycrystalline silicon substrate discs (e.g. SILSO) or monocrystalline silicon substrate discs. In the case of ferrosilicon, the substrate is not part of the active region of the solar cell, but impurity atoms diffused into the active region during manufacture of the cell, negatively influence the active region. The active region(s) are epitaxially grown on the substrate.

(b) p-Si Layer: thickness 5–50 $\mu$, produced by thermal decomposition of trichlorosilane. This layer, which is p-conductive due to the addition of boron, grows epitaxially on the substrate. This layer is an active region of the solar cell.

(c) n-Si Layer: thickness 0.5–5 $\mu$, likewise produced by thermal decomposition of trichlorosilane. This layer is n-conductive due to the addition of phosphorus and grows epitaxially on device (b). This layer is an active region of the solar cell.

The n-layer may also be formed by phosphorus diffusion into component (b).

The process according to the invention, employed for the gettering of silicon solar cells, in a pratical embodiment thereof, comprises the application of an amorphous or microcrystalline Si layer as getter layer on component(s) (a) and/or (b) and/or (c), e.g. by thermal decomposition of trichlorosilane with suitable manufacturing parameters, possibly applying thereafter one or a plurality of thin dielectric layers of a suitable material, then tempering the getter layer and the facultative additional thin dielectric layer in hydrogen gas for 10 to 180 minutes at temperatures from 600° C. to 950° C. and subsequently removing them again. In this way, impurity atoms are removed from the substrate (component A) so that the former can no longer diffuse into the active layer(s) (components (b) or (c), respectively), or impurity atoms are removed from the active layer(s).

In a solar cell treated according to the invention, the removal of the impurities leads to a higher yield of charge carriers released by light (extension of the diffusion length by the absence of recombination centers) and in better electrical behavior of the diode (the pn-junction), resulting in more effective separation of the generated charge carriers. Thus, more electrical energy can be generated from the incident light. As a whole, the efficiency of the solar cell is increased.

The advantage of the application of one or a plurality of dielectric layers compared to gettering with amorphous silicon/microcrystalline silicon alone is that a significantly larger number of impurity atoms can be gettered under the same tempering conditions. This has the particular result that the diffusion length of the minority charge carriers can be increased considerably. Since the yield of the cell is a function of the diffusion length, a greater diffusion length results in increased efficiency of the solar cell.

The process according to the invention can also be used to advantage for further devices, for example those devices (e.g., IC, LSI) which are produced by means of heteroepitaxy on substrates other than silicon (e.g. $Al_2O_3$). Furthermore, the process according to the invention is also suitable for use on devices (e.g. VLSI) having structures in the range of 1 micron, so as to reduce the reject quota during manufacture.

Moreover, the process according to the invention can also be used to advantage for the production of devices in which either the gettering time at increased temperatures is to be as short as possible or the diffusion of foreign atoms from the getter material into the Si crystal is undesirable. In particular, the following possible applications are listed here:

Production of bipolar integrated circuits on an impure silicon substrate (monocrystalline ferrosilicon free of dislocations).

The advantage of the novel process according to the invention for gettering semiconductor devices in the above-mentioned possible applications is that [in these cases] other gettering methods are impossible due to manufacturing conditions (e.g. gettering by greatly disturbed surfaces on the rear of the device if substrates other than silicon substrates are employed) or, due to the dimensions of the device structure, can only be performed, if at all, at considerable technological expense (e.g. gettering with $P_2O_5$ on devices having structures of 1 micron, where the undesirable diffusion of the doping substances during the gettering process is particularly critical.

What is claimed is:

1. Process for gettering a semiconductor device comprising the following steps:
    (1) applying a getter layer of amorphous or microcrystalline silicon onto the upper surface of the device to form a coated device;
    (2) thermally treating the coated device; and
    (3) removing the getter layer.

2. Process according to claim 1, wherein step (1) comprises applying a getter layer of amorphous or microcrystalline silicon in a layer thickness of several 100 Å to 10 $\mu$.

3. Process according to claim 1 or 2, comprising applying amorphous or microcrystalline silicon by deposition from the vapor phase by way of thermal decomposition of a silicon compound.

4. Process according to claim 1, comprising applying at least one dielectric layer of $SiO_x$, where $1 \leq x \leq 2$, onto the previously applied amorphous or microcrystalline silicon before thermally treating the coated device.

5. Process according to claim 1, comprising applying at least one dielectric layer of $Al_2O_3$ onto the previously applied amorphous or microcrystalline silicon.

6. Process according to claim 1, comprising applying at least one dielectric layer of $Si_3N_4$ onto the previously applied amorphous or microcrystalline silicon layer.

7. Process according to claim 1, comprising applying at least one dielectric layer of MgO, BeO, $ZrO_2$ or $TiO_2$ onto the previously applied amorphous or microcrystalline silicon.

8. Process according to claim 1, comprising, in step (2), heating the device in a gas atmosphere or in a vacuum.

9. Process according to claim 1, comprising simultaneously removing the dielectric layer and the getter layer by the action of a gas atmosphere.

10. Process according to claim 1, comprising initially removing the dielectric layer under the influence of an etching solution and then removing the getter layer by means of an acid mixture.

11. Process according to claim 1, wherein the device is a silicon solar cell, comprising precipitating a thin dielectric layer onto the amorphous or microcrystalline getter layer, and removing the dielectric layer and the getter layer after the thermal treatment.

12. Process according to claim 11, comprising applying the amorphous or microcrystalline silicon layer by thermal decomposition of trichlorosilane, applying the thin dielectric layer by precipitating $SiO_x$ where $1 \leq x \leq 2$ and thermally treating the coated device by tempering in hydrogen gas for 10 to 120 minutes at temperatures from 600° C. to 950° C.

13. Process according to claim 1, comprising applying at least one thin dielectric layer to the silicon layer between steps (1) and (2).

14. Process according to claim 13, comprising applying the thin layer to a thickness of from 30 Å to 3 micron.

15. Process according to claim 13, comprising applying the getter layer and dielectric layer simultaneously.

16. Process according to claim 11, wherein the silicon solar cell comprises a silicon substrate, a p-conductive silicon layer and an n-conductive silicon layer, comprising applying the amorphous or microcrystalline silicon getter layer to the substrate.

17. Process according to claim 11, wherein the silicon solar cell comprises a silicon substrate, a p-conductive silicon layer and an n-conductive silicon layer, comprising applying the amorphous or microcrystalline silicon getter layer to the p-conductive silicon layer.

18. Process according to claim 11, wherein the silicon solar cell comprises a silicon substrate, a p-conductive silicon layer and an n-conductive silicon layer, comprising applying the amorphous or microcrystalline silicon getter layer to the n-conductive silicon layer.

19. Process according to claim 8, comprising thermally treating the device in step (2) by heating for 10 minutes to 6 hours to a temperature of 200° to 1200° C.

20. Process according to claim 19, comprising thermally treating the device by heating to a temperature of 600° to 900° C.

21. Process according to claim 19, comprising heating the device in a gas atmosphere of $H_2$, $N_2$ or a noble gas.

* * * * *